United States Patent [19]

Clark, II et al.

[11] Patent Number: 5,686,912
[45] Date of Patent: Nov. 11, 1997

[54] DATA COMPRESSION METHOD AND APPARATUS WITH OPTIMIZED TRANSITIONS BETWEEN COMPRESSED AND UNCOMPRESSED MODES

[75] Inventors: Airell R. Clark, II, Albany; Brian R. Jung; Matthew P. Heineck, both of Corvallis, all of Oreg.

[73] Assignee: Hewlett-Packard Company, Palo Alto, Calif.

[21] Appl. No.: 437,263

[22] Filed: May 8, 1995

[51] Int. Cl.⁶ .................................................. H03M 7/34
[52] U.S. Cl. ........................... 341/51; 341/87; 341/106
[58] Field of Search ........................... 341/50, 60, 106, 341/51, 87

[56] References Cited

U.S. PATENT DOCUMENTS

| | | | |
|---|---|---|---|
| 4,509,038 | 4/1985 | Hirano | 340/348 DD |
| 4,558,302 | 12/1985 | Welch | 340/347 DD |
| 4,847,619 | 7/1989 | Kato et al. | 341/106 |
| 4,870,415 | 9/1989 | Van Maren et al. | 341/94 |
| 5,175,543 | 12/1992 | Lantz | 341/51 |
| 5,177,480 | 1/1993 | Clark | 341/51 |
| 5,373,290 | 12/1994 | Lempel et al. | 341/51 |

FOREIGN PATENT DOCUMENTS

| | | | |
|---|---|---|---|
| 0313190 | 4/1989 | European Pat. Off. | H03M 7/42 |
| 0372970 | 6/1990 | European Pat. Off. | H03M 7/48 |
| 0573208A1 | 8/1993 | European Pat. Off. | H03M 7/30 |

OTHER PUBLICATIONS

"Compression of Individual Sequences via Variable-Rate Coding" pp. 530–536, Jacob Ziv, and Abraham Lempel, IEEE Transactions on Information Theroty, vol. IT–24, No. 5, Sep. 1978.

Primary Examiner—Jeffrey A. Gaffin
Assistant Examiner—Thuy-Trang N. Huynh

[57] ABSTRACT

A method of compressing a stream of raw data including the steps of providing a memory device having compression active state and a compression inactive state, inputting a raw data segment into the memory device, generating a compressed data segment based on the raw data segment, creating output data based on the compressed data segment when the memory device is in the compression active state, otherwise based on the raw data segment when in the memory device is the compression inactive state, calculating a compression coefficient, and setting the state of the memory device based on the compression coefficient, such that compressed data is output only when compression has recently proven effective, and raw data is output when compression has recently proven ineffective. The method may also include decompression of the output data.

13 Claims, 8 Drawing Sheets

DATA COMPRESSION METHOD AND APPARATUS WITH OPTIMIZED TRANSITIONS BETWEEN COMPRESSED AND UNCOMPRESSED MODES

FIELD OF THE INVENTION

This disclosure relates to data compression and decompression methods and apparatus, and more particularly to implementations of data compression that are subject to occasional net expansion of data upon compression.

BACKGROUND AND SUMMARY OF INVENTION

Data compression is used to increase the storage capacity of digital data storage devices such as disc and tape drives, and memory chips. Whether the data is being stored indefinitely such as on a disc or tape, or temporarily in a memory chip during delivery to another destination, the data is compressed to a smaller size prior to storage, and decompressed upon retrieval. With lossless compression/decompression techniques, the decompressed data is identical to the original data.

Current compression/decompression techniques generally seek to maximize the amount of compression for a variety of data types. Offsetting factors limiting practical compression amounts are the cost of hardware and memory for compression operations, and the processor time required to perform the searching and data manipulation for compression. One effective compression/decompression technique uses the Lempel-Ziv (LZ) LZSD2 algorithm disclosed in coassigned U.S. patent application Ser. No. 08/192,878, filed Feb. 7, 1994, U.S. Pat. No. 5,455,576, issued Oct. 3, 1995 entitled Apparatus and Method for Lempel Ziv Data Compression with Improved Management of Multiple Dictionaries in Content Addressable Memory, the disclosure of which is herein incorporated by reference.

Like many compression techniques, the above referenced LZSD2 technique uses a "dictionary" containing a multitude of changeable entries reflecting common strings or segments of the data being compressed. Because most data tends to have repeated combinations of characters or other data patterns, the dictionary contains a brief unique code for each entry. As the data is compressed, the dictionary entries are created and updated, and the brief codes substituted for the (usually) longer strings they represent.

Occasionally, the dictionary code may be larger than the string it represents. This causes an undesirable expansion of data when the code is stored instead of the raw data. To avoid this result, various techniques have been employed. Dual buffers, one for raw data and one for compressed data, are filled with blocks of data. When one becomes entirely full, the other's more compact contents are output. However, this does not detect the variations of compressibility within a block of data, giving less compression for such a block. Also, control codes appended to the output to indicate whether the block is in the from of coded or raw data tend to reduce the net compression effectiveness by adding bits to the block, particularly if smaller blocks are employed. In addition, the buffers require significant memory when implemented in software, and significant integrated circuit area when implemented in hardware.

The disclosed apparatus and method avoid or reduce these disadvantages by providing a method of compressing a stream of raw data comprising the steps of providing a memory device having compression active state and a compression inactive state, inputting a raw data segment into the memory device, generating a compressed data segment based on the raw data segment, creating output data based on the compressed data segment when the memory device is in the compression active state, otherwise based on the raw data segment when the memory device is in the compression inactive state, calculating a compression coefficient, and setting the state of the memory device based on the compression coefficient, such that compressed data is output only when compression has recently proven effective, and raw data is output when compression has recently proven ineffective.

The method may also include decompression of the output data, and may be performed in a circuit comprising a memory device for receiving a stream of uncompressed data, a compression element operable to receive a raw data segment from the memory device and operable to generate a compressed data segment based on the raw data segment.

The compression element may have an active state and an inactive state, wherein the compression element outputs the compressed data segment when in the active state, and outputs the raw data segment when in the compression inactive state, and the circuit may include a comparator connected to the compression element for calculating a compression coefficient based on at least the size of the raw data segment and the compressed data segment, and for changing the compression element between the active and inactive states based on the compression coefficient, such that compressed data is output only when compression has recently proven effective, and raw data is output when compression has recently proven ineffective.

DETAILED DESCRIPTION OF A PREFERRED EMBODIMENT

Figure 1:
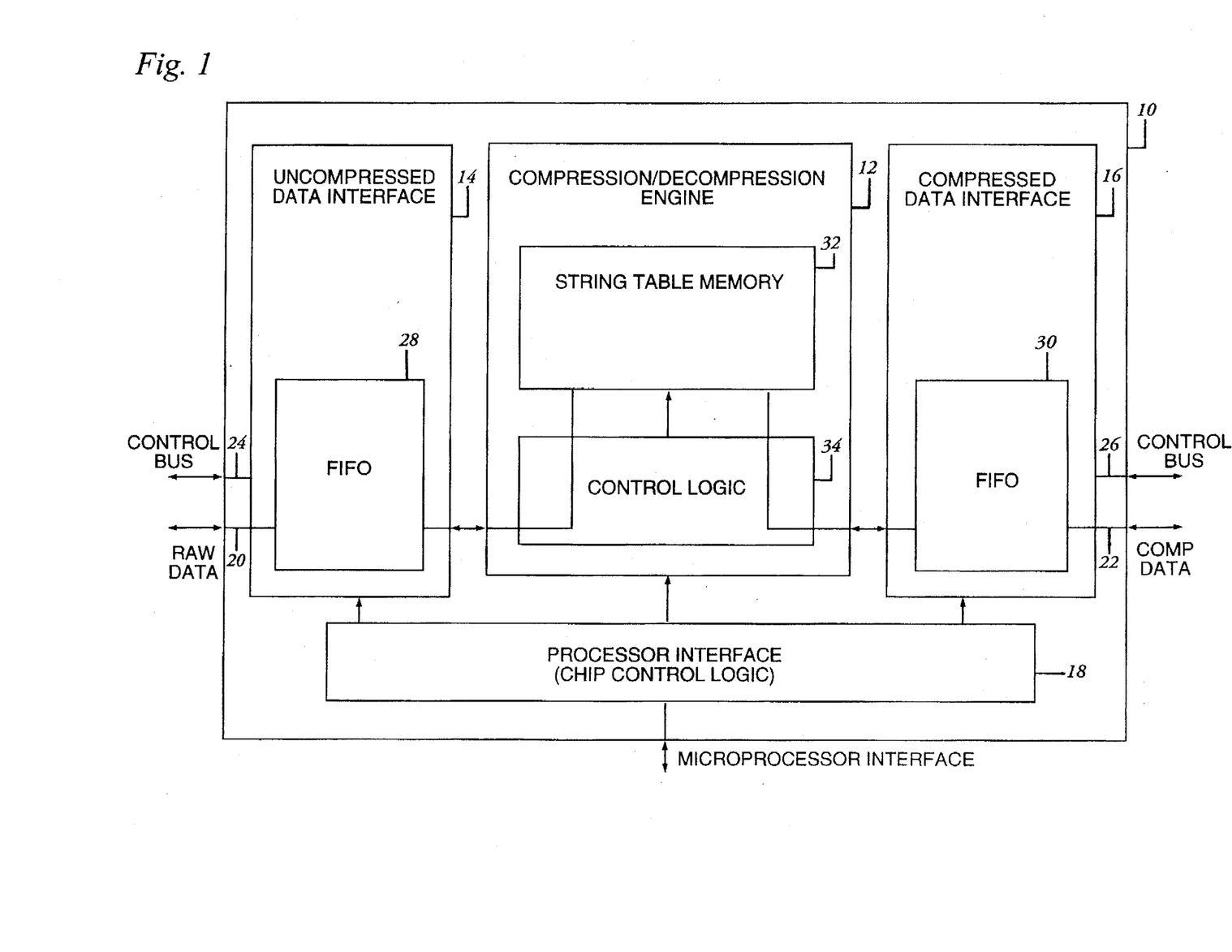
FIG. 1 is a block diagram of a circuit according to a preferred embodiment of the invention.

FIG. 1 is a block diagram of a compression/decompression circuit 10 for a dictionary based system according to a preferred embodiment of the invention. The circuit includes a compression/decompression (CD) engine 12, an uncompressed data interface 14, a compressed data interface 16, and a processor interface 18. The uncompressed interface 14 transfers uncompressed or raw data over a data bus 20, and the compressed interface 16 transfers compressed data over a data bus 22. External control signals for interfaces 14 and 16 are received over control busses 24 and 26, respectively. Each interface 14, 16 contains a respective First-in/First-out (FIFO) data buffer 28, 30 and additional conventional interface circuitry.

In the compression mode, the uncompressed data interface 14 receives uncompressed data blocks, strings, segments, or characters from the data bus 20 and supplies them via data buffer 28 to the compression/decompression engine 12. A string table memory or dictionary 32 and control logic 34 within the CD engine 12 compress the characters into code words that may be output on data bus 22. The control logic includes a mode switch that is switchable between a compression active state in which the raw data is compressed, and a compression inactive or raw mode state in which raw data is simply output as raw data in its original form. The control logic also includes a comparator including a calculator for measuring and comparing the relative size or length of raw data strings and the corresponding compressed code. The calculator has a register for generating a moving average. Together, the comparator, calculator, and register are identified collectively in FIG. 1 as control logic 34.

In the decompression mode, the compressed data interface 16 receives possibly compressed data including code words and/or raw data from the data bus 22, and provides them to the CD engine via data buffer 30. The dictionary 32 and control logic 34 cooperatively decompress the data code words into raw data strings and output the result on data bus 20 via buffer 28.

Figure 2:
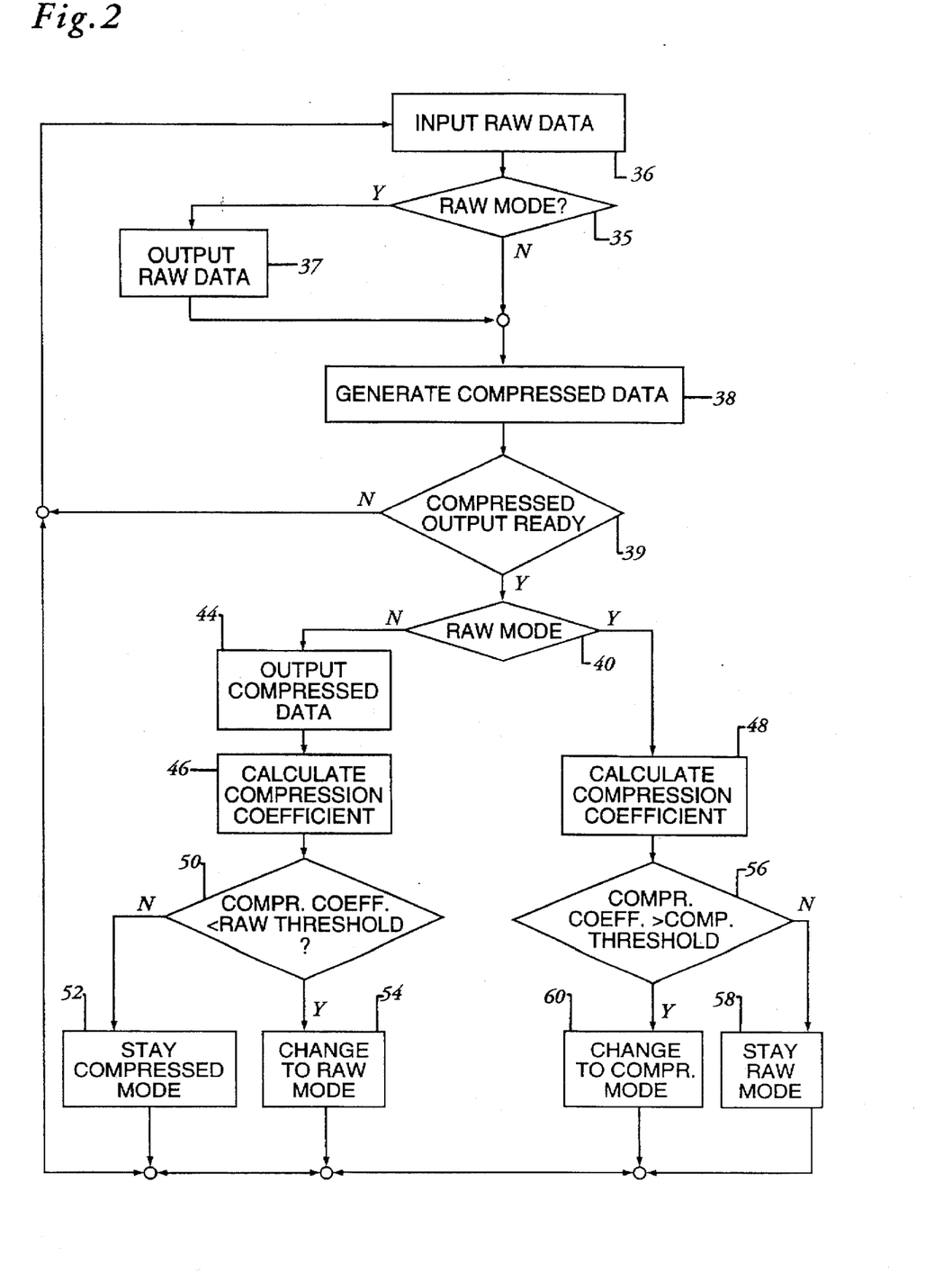
FIG. 2 is a simplified flow chart showing data compression according to a preferred embodiment of the invention.

FIG. 2 shows a simplified compression flow chart. Initially, raw data is input at block 36. Subsequently, step 35 determines whether the circuit is in raw mode. If so, the raw data is output per step 37, without having been stored in a buffer. The raw data is preferably in the form of an 8 bit character which, alone or in conjunction with a string of prior characters, is the subject of a search in the dictionary in step 38. If found, the code associated with the character or string is noted, if not found, the character or string is encoded as a new entry, and a new code is created. The resulting code is effectively generated in step 38. With the preferred LZSD2 compression technique, the dictionary entries are updated and may be shifted between dictionaries. In step 39, it is determined whether the compressed data is ready for output, or whether the input cycle should be repeated in hopes of generating a larger data block to be stored under a single dictionary code for more effective compression.

Step 40 determines whether the circuit is in raw mode or compressed mode. If in compressed mode, the compressed code is output as in step 44. After outputting the data, and before reading new data, the circuit calculates a compression coefficient (CC) in step 46. If in raw mode, the circuit proceeds directly to the calculation of a CC in step 48, having already output the raw data in step 37.

The compression coefficient is a moving average based on a compression ratio of the current raw data string size to the current compressed code size, and on the previous compression coefficient. In the preferred embodiment, the previous CC is multiplied by 63/64 and summed with 1/64th of the current compression ratio. Division by a "SPAN" of 64, which can be expressed as an exponent $2^n$ (n being an integer), permits a simple bit shift to achieve the calculation. A six bit shift provides division by 64, and subtraction of a six-bit-shifted instance oft he previous CC from itself provides multiplication by 63/64. The use of a moving average is useful for data that, as most data, exhibits a significant correlation between current compressibility and previous compressibility. The SPAN value should preferably be between 16 and 128, although other values may be suitable for some applications.

After a compression coefficient is calculated in the compressed mode, step 50 determines whether the CC has fallen below a raw threshold of preferably 1.0. While the CC remains above 1.0, compression over the recently weighted history is having some beneficial compressive effect, and the circuit stays in compressed mode as noted in step 52. When CC drops below 1.0, expansion of data has occurred and is likely to continue to occur. Therefore, step 54 requires changing to raw mode so that future data is not expanded by attempts to compress it.

After a compression coefficient is calculated in the raw mode, step 56 determines whether the CC has risen above a compression threshold of preferably 1.0. While the CC remains below 1.0, the circuit stays in raw mode as noted in step 58. When CC rises above 1.0, the trend in the characteristics of the data suggests that there will be a compressive benefit to switch to compression mode as in step 60. Although the raw and compression thresholds are both set to 1.0 in the preferred embodiment, the compression threshold may be set slightly greater than the raw threshold to provide hysteresis that avoids jumping between modes in cases of marginal compressibility. After changing or maintaining modes, the process repeats by inputting new raw data in step 36.

Figure 3:
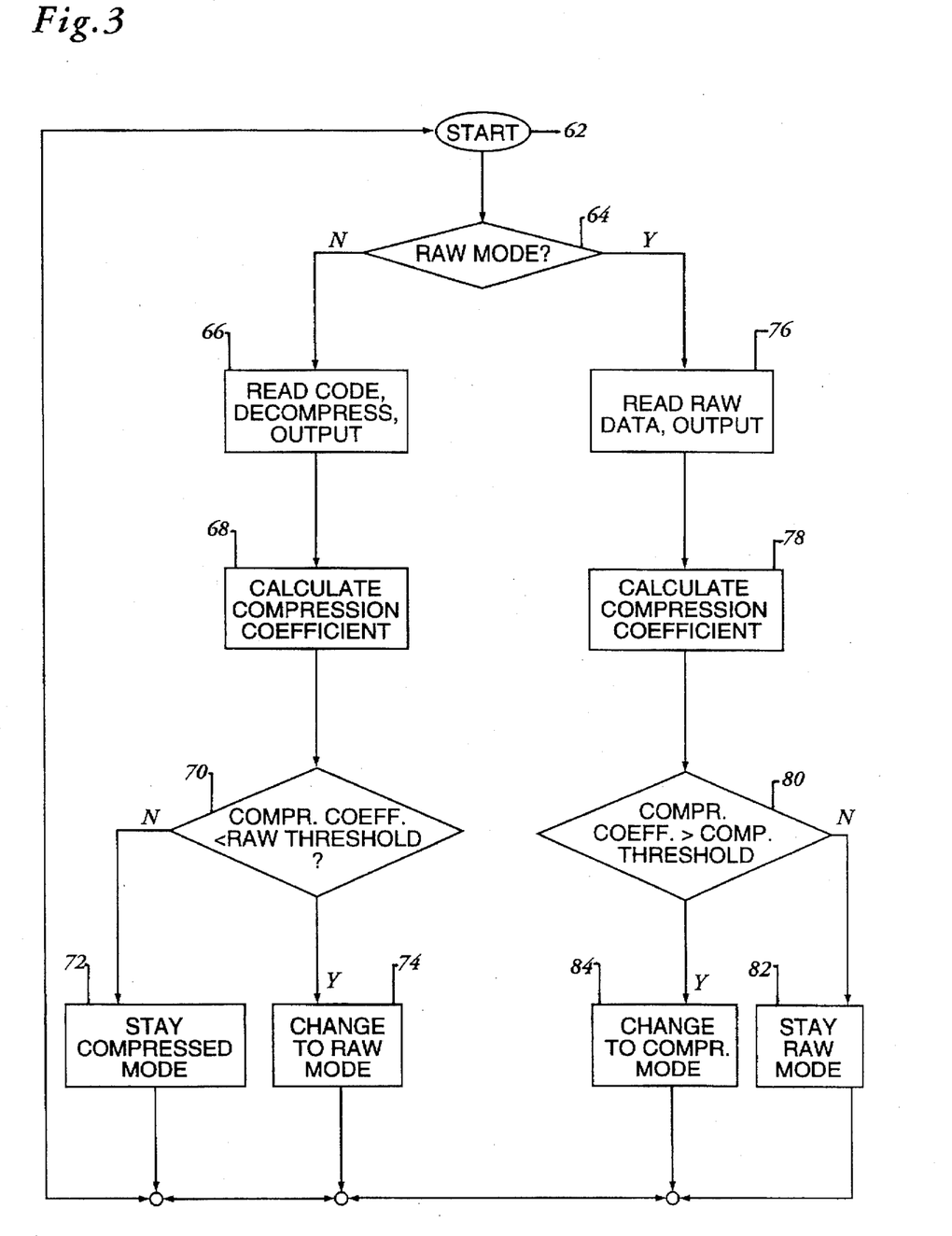
FIG. 3 is a simplified flow chart showing data decompression according to a preferred embodiment of the invention.

FIG. 3 shows a simplified decompression flow chart. Selectively compressed output generated by the above process does not contain any codes indicating whether particular segments of the "compressed" data are in fact compressed or raw. Basically, the decompression process infers from the data whether the data was compressed by repeating the calculation of the compression coefficient. By following the same rules, using the same formulae, and using the same thresholds, the decompression process mimics the original compression process to achieve the same results. For instance, when during decompression of compressed data the compression coefficient drops below the raw threshold upon decompression, it will be known that the next segment of data will be in raw mode.

Step 62 is the start of the cycle during ongoing decompression. If step 64 indicates that the circuit is not in raw mode, but in compression mode, the next data segment is read as code in step 66, then decompressed by looking up the dictionary entry corresponding to the code, and output as decompressed data. Based on a comparison of the compressed code and the decompressed data, a compression coefficient is calculated in step 68 using the same formula as during compression. The CC is compared with the raw threshold in step 70. If it remains above the threshold, the circuit stays in compressed mode per step 72. If the CC has fallen below the raw threshold, step 74 indicates that the circuit is switched to raw mode.

When in raw mode, data is read as raw data and output in step 76. Then, a compression coefficient is calculated in step 78 as in step 68. Step 80 compares the CC to the compression threshold. If the CC remains below the threshold, the circuit remains in raw mode per step 82. If the CC rises above the threshold, step 84 requires a change to compressed mode. During decompression, the dictionaries are created and modified in exactly the same manner as during compression to ensure that the compression codes and corresponding entries provide precise decoding.

Figure 4A:
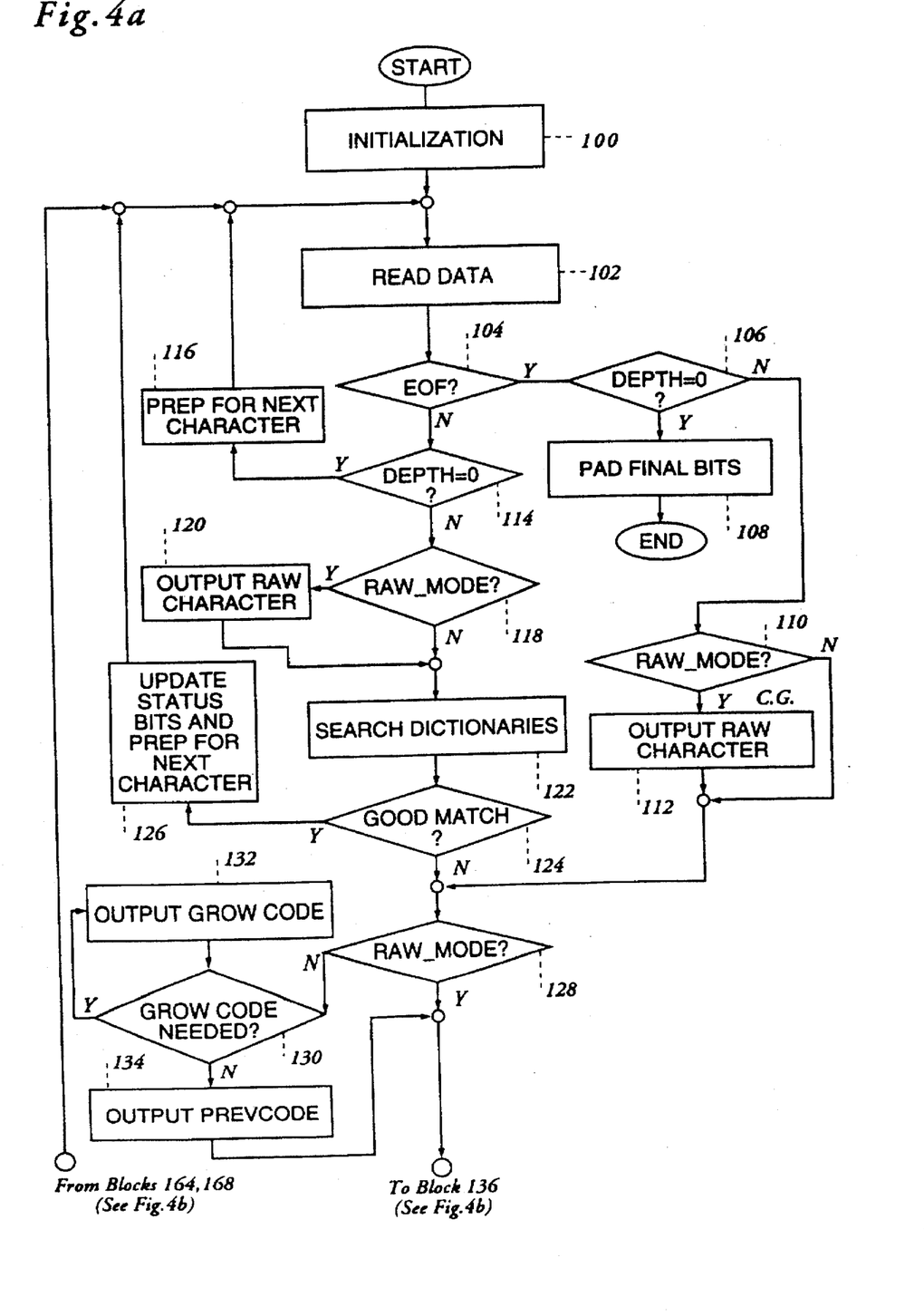
FIGS. 4a and 4b are portions of a detailed flow chart showing data compression according to a preferred embodiment of the invention.
Figure 4B:
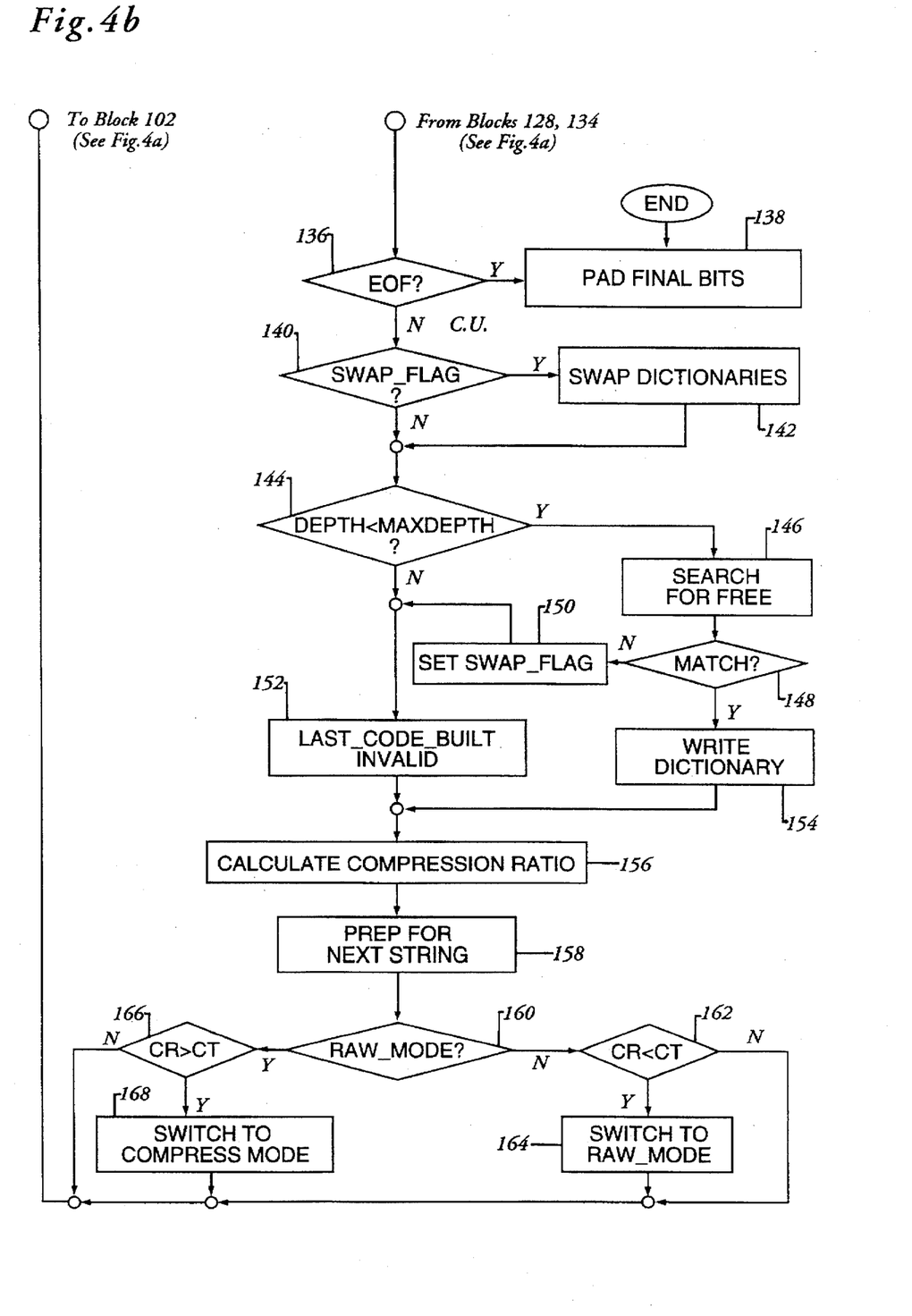

FIGS. 4a–b—Detailed Compression Example

| Glossary of variables: | |
|---|---|
| CAM | The Dictionary. Each dictionary entry contains ([MAXBITS bit code], [WS bit character], [2 bit status field]). |
| CD | Two bit Status value which indicates that the dictionary entry is in the Current Dictionary. |
| CH | WS bit variable which contains the most recent input character. |
| CODE_SIZE | The number of bits currently used for each output code. The minimum is (WS + 1) and the maximum is MAXBITS which is determined by the dictionary size. $2^{MAXBITS} >=$ (Number of dictionary entries) + (Number of root codes (typically 256)) + (Number of control codes). |
| CR | Variable which contains the current moving average compression ratio. This is equal to the compression coefficient (CC) discussed above. |
| CT | Compression Trigger. If CR rises above CT, then the compressor will switch from raw mode to compress mode. |
| DEPTH | Variable which contains the number of characters in the string represented by PREVCODE. The size of this variable is determined by MAXDEPTH. |
| EOF | When set, this flag indicates that an attempt to read data from the input stream failed because the end of the data stream was reached. |
| FOUNDCODE | When the dictionary is searched for a string that matches the input data and a match is found, this MAXBITS bit variable is assigned the address at which the match was found. |
| FREE/PD | Two bit Status value which indicates that the dictionary entry is in the Previous Dictionary. It also indicates that the location can be overwritten |
| GROW | A CODE_SIZE bit control code which signals the decompressor to start reading one more bit for each compressed code. |
| INVALID | This is any MAXBITS bit code that is not a dictionary entry, i.e. a control code or a root code. |
| LAST_CODE_BUILT | MAXBITS bit variable which contains the address of the most recently built code. |
| MATCH | This indicator is true if a search of the dictionary succeeded in finding a match. |
| MAXBITS | This is the maximum number of bits in an output code. |
| MAXCR | This is the maximum value the CR is allowed to contain. If CR becomes greater than MAXCR, then CR is set equal to MAXCR. |
| MAXDEPTH | The maximum string length that a code is allowed to represent. |
| NEXTCODE | MAXBITS bit variable which contains the address of the dictionary entry that is to be overwritten with the new string. |
| PREVCODE | MAXBITS bit variable which contains the address of the best dictionary match that has been found so far. |
| PREVCH | WS bit variable which contains the previously read character (CH). |
| RAW_MODE | This indicator is true if the input data is being output without encoding. If this indicator is false, then the compressed codes are being output. |
| RT | Raw Trigger. If CR falls below RT, then the compressor will switch from compress mode to raw mode. |
| SD | Two bit Status value which indicates that the dictionary entry is in the Standby Dictionary. |
| SWAP_FLAG | This indicator is true when a dictionary swap is needed. |
| WS | Input Word Size. Typically data is read in and output in 8 bit words. Other values are possible. |

Compression Flowchart Steps

Initialization 100. At start up, all of the normal LZSD2 start-up procedures must be followed. The compressor is put in a known, consistent state. Each dictionary entry is set to some predetermined value, typically (0x000,0x00,FREE/PD). The Output formatter is reset to its empty initial state. The SWAP_FLAG is unset, CODE_SIZE is set to minimum (9), LAST_CODE_BUILT is set to INVALID, and DEPTH is set to 0. The expansion protection specific initializations are to set the RAW_MODE flag so that the first few characters are output unencoded and to initialize the compression ratio moving average (CR) to its start up value, typically one.

Read Data 102. Get an WS bit character from the input stream and assign it to variable CH.

EOF? 104. If Read Data failed due to reaching the end of the input stream then exit this control box at the Y point which will end the compression process and output any remaining information. If Read Data succeeded, exit at the N point to continue the compression process.

DEPTH=0? 106. If DEPTH=0 then PREVCODE has 0 string length and PREVCH has already been at least partially output. Exit at the Y point which will output any remaining bits. DEPTH=0 after EOF only occurs immediately after Initialization or immediately after a mode switch from raw mode to compress mode. If DEPTH!=0 then exit at the N point which will output any remaining codes or characters.

Pad Final Bits 108. The last code or character output may not completely fill the last output word. Statistically, only 1 out of WS will do so. In the other (WS−1) cases the leftover bits need to be padded with 0's (or 1's, it really doesn't matter) out to WS bits and this final word is then output. At this point, the compression process is finished.

RAW_MODE 110. If the RAW_MODE flag is set then exit at the Y point which will output PREVCH, the final character of the data stream. If the RAW_MODE flag is not set then exit at the N point which will output PREVCODE, the final code of the data stream.

Output Raw Character 112. Output PREVCH by packing the WS bits of this character with the leftover bits of the previous character or code output into WS bit words. Output all complete words to the output stream.

DEPTH=0? 114. If DEPTH=0, then exit at the Y point because PREVCODE has 0 string length and PREVCH is either unset or has already been output. The Y route will assign a valid one character string to PREVCODE and the appropriate character to PREVCH. DEPTH=0 only occurs immediately after Initialization or immediately after a switch to compress mode. If DEPTH>0, then exit at the N point to continue with the compression cycle.

Prep For Next Character 116. This step takes the input character (CH) and assigns it to PREVCODE. PREVCODE now represents a one character string and so DEPTH is set to 1. The input character (CH) is also assigned to PREVCH.

RAW_MODE 118. If the raw mode flag is set then exit at the Y point which will output PREVCH. If the raw mode flag is not set then exit at the N point which will continue with the compression process by doing a dictionary search.

Output Raw Character 120. Output PREVCH by packing the WS bits of this character with the leftover bits of the previous output character or code into WS bit words. Output all complete words to the output stream.

Search Dictionaries 122. Search the dictionary for a location which contains PREVCODE in the code field and CH in the character field. Do not look at the status field when doing the search. Use a priority encoder to resolve multiple matches by selecting the match address with the lowest value. If a location is found which matches (PREVCODE, CH, *), then set the MATCH flag and assign the match address to FOUNDCODE. If no location is found which matches (PREVCODE, CH, *) then unset the MATCH flag.

GOOD MATCH? 124. Having the data (PREVCODE, CH, *) in the dictionary is not enough to determine whether FOUNDCODE is an acceptable compress mode output code. First, FOUNDCODE cannot be equal to LAST_CODE_BUILT which prevents the most recently built dictionary entry from being used as an output code. Secondly, in certain rare cases, it is possible for a string to be in the dictionary that is longer than MAXDEPTH. To prevent outputting a string like this the string length of FOUNDCODE must be checked. If the string is in the dictionary and the other two tests are OK, then exit this decision box at the Y point which will get another character to add to the string. If the string is not in the dictionary or either of the other two test fail, then exit at the N point which will output PREVCODE, if not in raw mode, and may add (PREVCODE, CH, CD) to the dictionary.

Update Status Bits and Prep For Next Character 126. If FOUNDCODE was a good match, then it needs to be put in the Standby Dictionary (SD). To do this, the status field at FOUNDCODE is set to SD. Then PREVCODE is set equal to the best string match found so far, namely FOUNDCODE and the DEPTH variable is incremented to the new string length of PREVCODE. Lastly, PREVCH is set to the current input character (CH).

RAW_MODE 128. If the raw mode flag is set then exit at the Y point which may add a new string to the dictionary. If the raw mode flag is not set then exit at the N point which will output PREVCODE and then add a new string to the dictionary.

GROW Code Needed? 130. If the code about the be output, PREVCODE, is greater or equal to 2^CODE_SIZE, then it cannot be represented by CODE_SIZE bits. In this case, exit at the Y point which will increase CODE_SIZE. If PREVCODE can be represented by CODE_SIZE bits, then exit at the N point which will output the code.

Output GROW Code 132. Output a GROW control code using CODE_SIZE bits. The code must be packed into words by the formatter before it can be output. Increment CODE_SIZE so all future output codes will be represented by one more bit than before. It is possible, though rare, for the output code to require more than one more bit in order to be output. To handle this case, it is necessary to go back and check if another grow code is needed before actually outputting PREVCODE.

Output PREVCODE 134. Output PREVCODE using CODE_SIZE bits. The code together with the leftover bits from the previous output code or character must be packed into words by the formatter before it can be output to the output stream.

EOF? 136. This is essentially a continuation of EOF? 104. The Y point of EOF? 104 may come back into the main compression flow in order to output the last best match code. The flowchart could simply repeat the output GROW code and PREVCODE steps at the Y point of EOF? 104 but this method makes it clear that the output functionality is the same for the final code as it is for all previous codes. If the end of the input stream has been reached then exit at the Y point, else exit at the N point.

Pad Final Bits 138. The last code output may not completely fill the last output word. Statistically, only 1 out of WS will do so. In the other (WS–1) cases the leftover bits need to be padded with 0s (or 1s) out to WS bits and this final word is then output. At this point, the compression process is finished.

SWAP_FLAG? 140. If the SWAP_FLAG is set then exit at the Y point which will swap the dictionaries. If it is not set then exit at the N point which may update the dictionary with (PREVCODE, CH, CD).

Swap Dictionaries 142. Since the status field is two bits, there are four possible codes: 00 01 10 11. These codes are mapped to SD, CD, FREE/PD, and INV (invalid), not necessarily in that order. Swapping the dictionaries does not actually change any data in the CAM. What changes is how the status field is interpreted. The code that represented SD represents CD after the swap, CD switches to FREE/PD, FREE/PD becomes INV, and INV becomes SD. INV remains empty because FREE/PD was empty before the swap so INV is empty afterwards. Also, since INV was empty before the swap (INV is always empty), after the swap, the Standby dictionary (SD) is empty.

DEPTH<MAXDEPTH? 144. If the string length of PREVCODE is less than the maximum string length then exit at the Y point which will add (PREVCODE, CH, CD) to the dictionary if there is a location available. If DEPTH>= MAXDEPTH then exit at the N point which will not add (PREVCODE, CH, CH) to the dictionary as it is too long to be used as an output code.

Search for Free 146. Search the dictionary for a location which contains FREE/PD in the status field. Do not look at the Code or Character fields when doing the search, i.e. a match can be successful no matter what the Code or Character fields contain. Use a priority encoder to reduce possible multiple matches to the one with the lowest value. If a location is found which matches (*,*,FREE/PD) then set the MATCH flag and assign the match address to NEXTCODE.

MATCH? 148. If the search for a FREE/PD location was successful then exit at the Y point which will add (PREVCODE, CH, CD) to the dictionary at the matched location. If the search for (*,*,FREE/PD) failed, then exit at the N point which will signal that a dictionary swap is needed. Failure to find a FREE/PD location also means that the string represented by (PREVCODE, CH) will not be entered into the dictionary.

Set SWAP_FLAG 150. Set the indicator which signals that a dictionary swap is needed. The dictionary is not swapped immediately so that the decompression dictionary can stay synchronized with the compression dictionary. The dictionary will be swapped after the next string's status field bits have been switched to SD.

LAST_CODE_BUILT=INVALID 152. LAST_CODE_BUILT is used to prevent the compressor from outputting the most recently built code. However, if a (PREVCODE, CH) combination that could have been built but was not because the maximum string length was exceeded or the dictionary was full then the most recently built code can be used as an output code. To facilitate this, LAST_CODE_BUILT is set to an INVALID address which cannot be matched in the search operation.

Write Dictionary 154. Write (PREVCODE, CH, CD) into the CAM at address NEXTCODE. This extends the string which was output, PREVCODE, by the character CH. The string is placed into the current dictionary (CD) where is will stay until it is found again in the input stream and promoted to SD or a dictionary swap is done and it is demoted to FREE/PD.

Calculate Compression Ratio 156. The compression ratio (coefficient) calculation is done in way that gives more weight to the most recent codes. The Formula used is:

$$CR=CR-(CR/SPAN)+(DEPTH \times WS/CODE\_SIZE) \times 1/SPAN$$

SPAN controls the weight of recent codes versus older codes. The larger SPAN is, the less weight recent codes are given. Good results can be obtained using values for SPAN which are between 20 and 100, as determined empirically, but these are not absolute limits. Using a value for SPAN that is a multiple of 2 makes some of the math operations easier and faster in hardware by permitting a simple bit shift for multiplying or dividing functions. The preferred embodiment uses a value of 64 for SPAN.

Since DEPTH is the string length of PREVCODE, the expression (DEPTH×WS/CODE_SIZE) is the compression ratio for PREVCODE (i.e. the number of bits in the string represented by PREVCODE divided by the number of bits in the code PREVCODE). This calculation is done for each output code while in compress mode and for each code that would have been output if not in raw mode, while in raw mode.

Prep for Next String 158. Use CH as the initial string for the next search, i.e. assign CH to PREVCODE. PREVCODE now represents a one character string and so DEPTH is set to 1. Assign CH to PREVCH for possible use as the next raw character.

RAW_MODE? 160. If in raw mode then exit at the Y point which will decide if a switch to compress mode is desired. If not in raw mode, then exit at the N point which will decide if a switch to raw mode is desired.

CR<RT? 162. If the compression ratio (CR) is less than RT then exit at the Y point which will switch the compressor to raw mode. The typical value for RT is 1 but any other values can be used as long as it is less than or equal to the value used for CT (see 166.). If CR is greater than or equal to RT then exit at the N point which will go back to the top of the flow to read the next character.

Switch to Raw Mode 164. Switching to raw mode is done by simply setting the RAW_MODE flag. From here go to the top of the flow to read the next character.

CR>CT? 166. If the compression ratio (CR) is greater than CT then exit at the Y point which will switch the compressor from raw mode to compress mode. The typical value for CT is 1 but any other value can be used as long as it is greater than or equal to the value used for RT (see step 162). If CR is less than or equal to RT then exit at the N point which will go back to the top of the flow to read the next character.

Switch to Compress Mode 168. The switch from raw mode to compress mode is more complicated than the reverse. First, output PREVCH to the formatter which will pack it into words and output all completed words. Then set DEPTH equal to 0 and LAST_CODE_BUILT to INVALID. Lastly, unset the RAW_MODE flag. From here go to the top of the flow to read the next character.

Figure 5A:
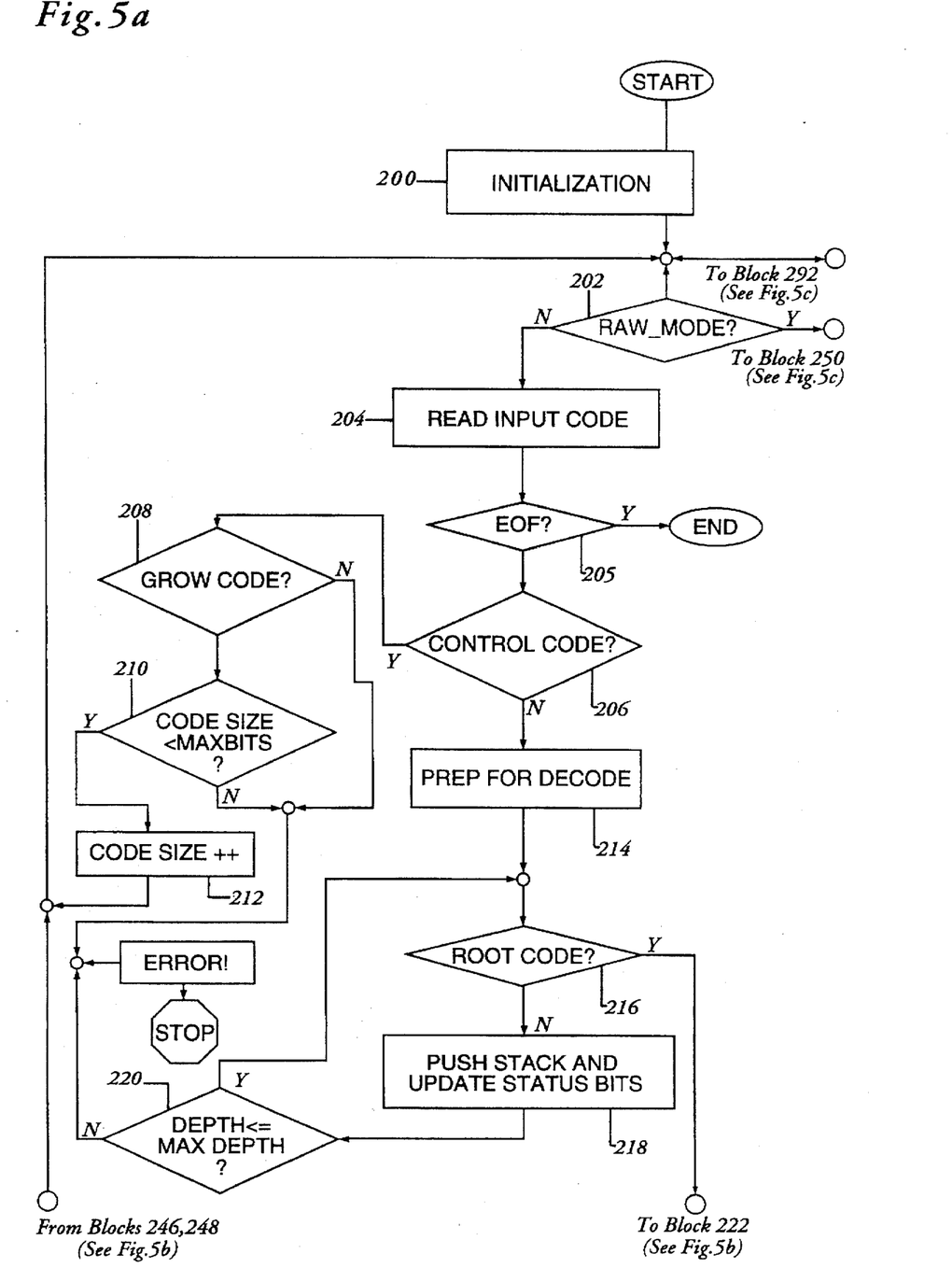
FIGS. 5a, 5b, and 5c are portions of a detailed flow chart showing data decompression according to a preferred embodiment of the invention.
Figure 5B:
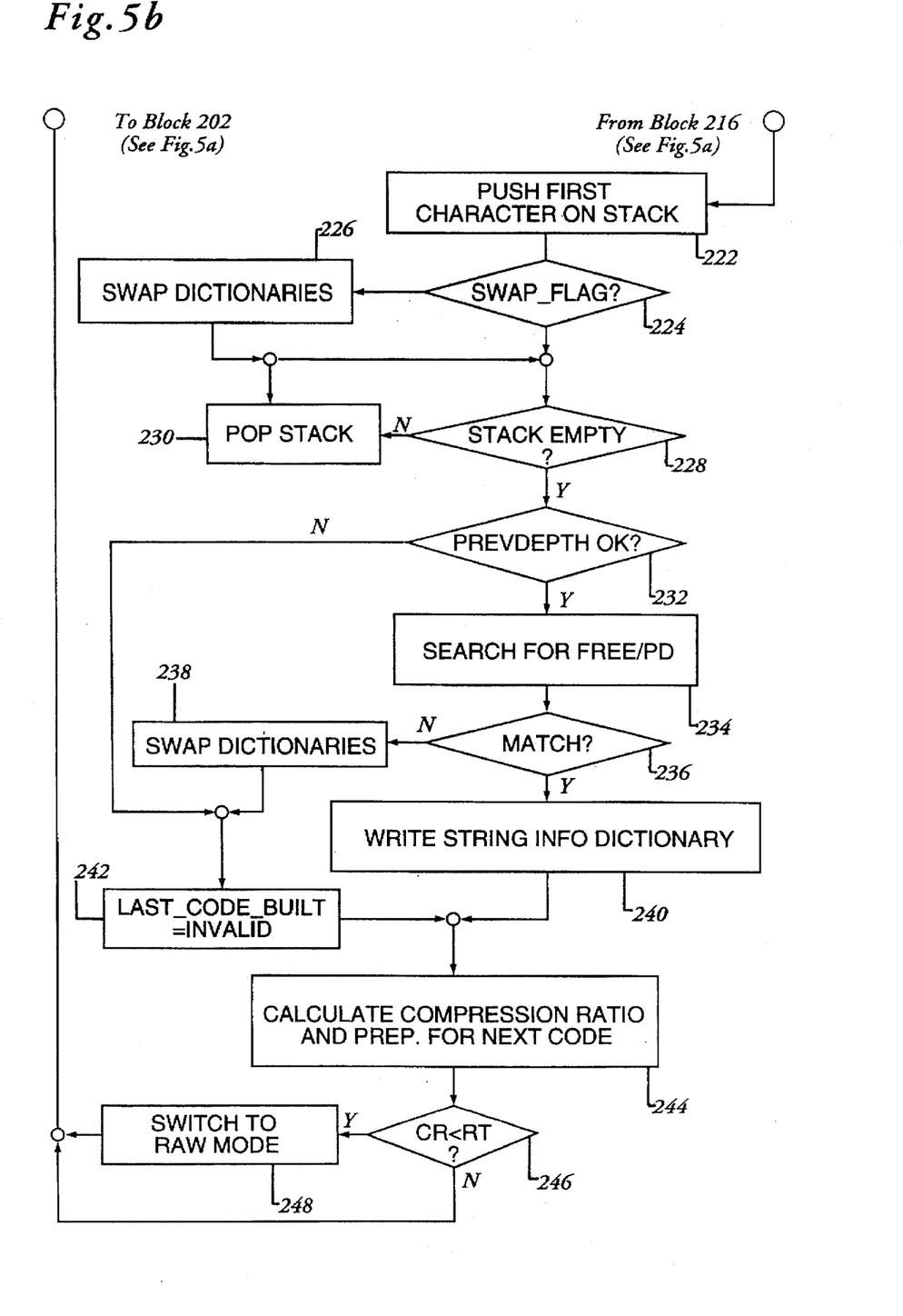
Figure 5C:
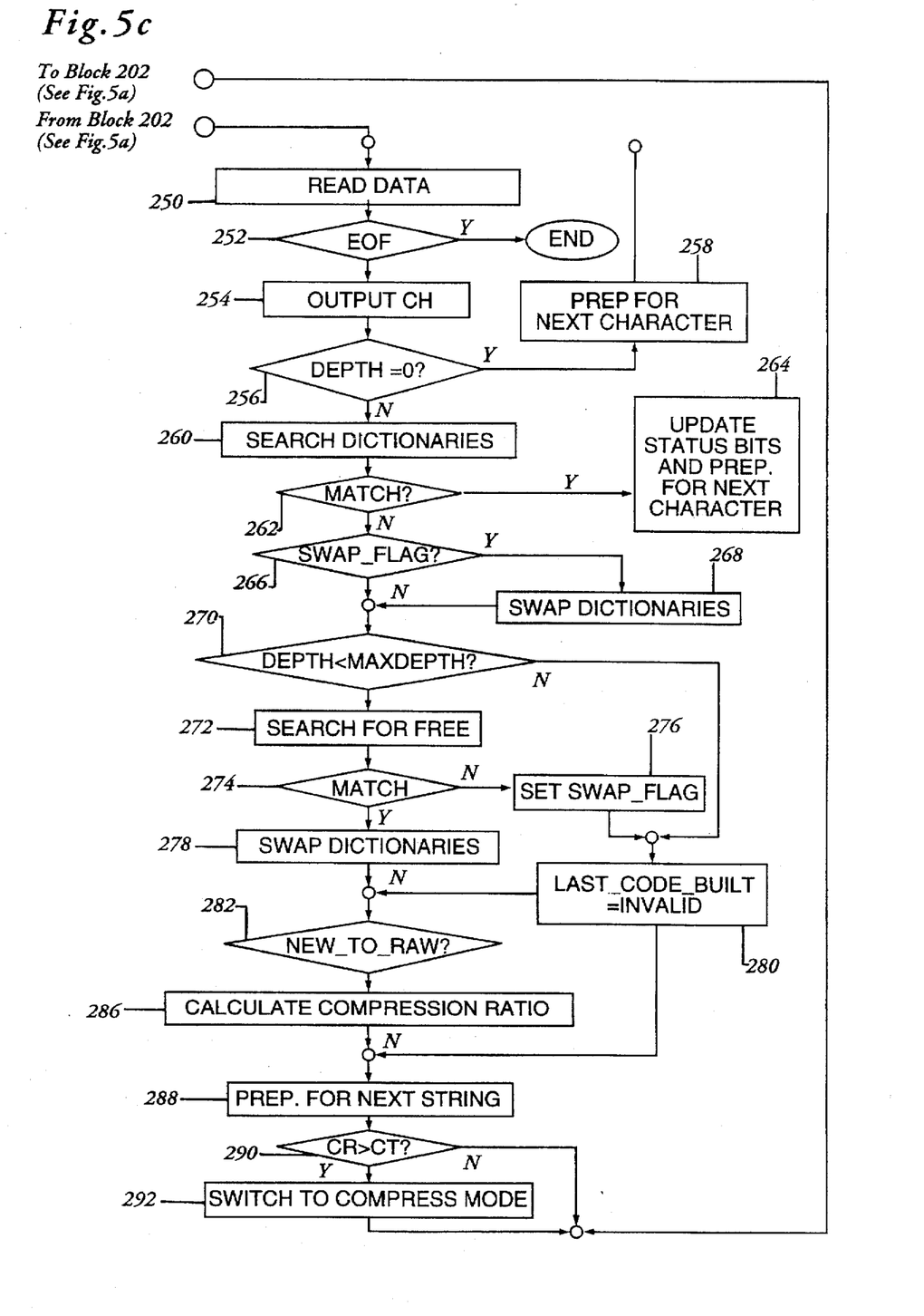

FIGS. 5a–c—Detailed Decompression Example

Supplementary glossary of variables for decompression:

| | |
|---|---|
| CODE | This MAXBITS bit variable is represents the first n–1 characters of then character string represented by TCODE. |
| FIRST_CHAR | WS bit variable which is set to the first character of INCODE after INCODE has been decoded. |
| NEW_TO_RAW | This indicator is used after a switch from compress mode to raw mode to signal that a switch has recently occurred. |
| PREVDEPTH | Variable which keeps track of the string length of PREVCODE. |
| STACK | LIFO stack which is WS bits wide and MAXDEPTH entries deep. It is used to reverse the string decoded from INCODE. |
| TCODE | MAXBITS bit variable which is used as a temporary code holder during the decoding of a string. |
| TDEPTH | Variable which keeps track of the number of characters on the STACK while unloading the STACK. |

Decompression Flowchart Steps

Initialization 200. At start up, all of the normal LZSD2 start-up procedures must be followed. The compressor is put in a known, consistent state. Each dictionary entry is set to some predetermined value, typically (0x000,0x00,FREE/PD). The input formatter is reset to its empty initial state. CODE_SIZE is set to minimum (9) and PREVDEPTH is set to 0. The expansion protection specific initializations are to set the RAW_MODE flag, unset the NEW_TO_RAW flag, unset the SWAP_FLAG, set DEPTH to 0, set LAST_CODE_BUILT to INVALID, and set the initial moving average compression ratio (CR) to its start up value, typically one.

RAW_MODE? 202. If the RAW_MODE indicator is set then exit at the Y point which will follow the raw mode decompression flow. If the RAW_MODE indicator is not set then exit at the N point which will follow the compress mode decompression flow.

Read Input Code 204. Read a word from the input stream and unpack it into a CODE_SIZE bit codes. If there are not enough bits available, read more words until there are enough. Assign the code to INCODE. Keep leftover bits for use in the next code.

EOF? 205. If the Read Input Code failed due to reaching the end of the file (EOF), then the decompression process is finished. Exit at the Y point which will end the algorithm. If Read Input Code did not fail due to EOF, then exit at the N point which will continue the algorithm.

Control Code? 206. If INCODE is a reserved code then exit at the Y point which will determine which reserved code it is and take the appropriate action. If INCODE is not a reserved code, then exit at the N point which will continue with the decompression process by converting the code into a string.

GROW Code? 208. If INCODE is a GROW code, then exit at the Y point which will execute the steps necessary to grow the code size. If INCODE is not a GROW code, then exit at the N point. If other control codes are needed, this is where they will be evaluated. Currently this algorithm only uses one reserve code so an N point exit means an algorithm failure.

CODE_SIZE less than Maximum Code Size? 210. A GROW code indicates to the decompressor that all future codes will be one bit longer than what is currently being used. If the current CODE_SIZE is already at the maximum when a GROW code is encountered, then an error has occurred. Exit at the N point which will signal an error and stop the process. If CODE_SIZE is less than the maximum code size, then exit at the Y point which will increase the code size by one bit.

Increment CODE_SIZE 212. Increase the value of CODE_SIZE by one. This means that all future codes will be one bit longer than before. From here, go to the top of the algorithm to read another code. Although the flow chart shows the return to top going to step 202. It is equally valid and possible more efficient to go to step 204.

Prep for Decode 214. Initialize for decoding of INCODE. Since INCODE represents at least a one character string, we will count it now by setting DEPTH to 1. Since INCODE will be needed later in the algorithm, we must use a different variable or register during decoding; set TCODE (Temporary inCODE) equal to INCODE.

Root Code? 216. If TCODE is less than 256 it represents a one character string. Exit at the Y point which will put this one character on the string reversal STACK. If TCODE is greater than or equal to 256, then is must be a multiple character string. Exit at the N point which will put the last character of the string represented by TCODE onto the string reversal STACK.

Push STACK and Update Status Bits 218. Put the character at CAM address TCODE onto the top of the STACK. This character is the last character in the string represented by TCODE. Put TCODE into the Standby Dictionary by setting the Status bits at CAM address TCODE to SD. Add one to DEPTH which is equal to the number of characters on the STACK plus one. The plus one is the first character of the string that we counted in the Prep for Decode step. Lastly, take the code at CAM address TCODE and assign it to TCODE. TCODE now represent the remaining string which has not yet been decoded.

DEPTH<=MAXDEPTH? 220. DEPTH must be less than or equal to MAXDEPTH, if it is not, the LIFO string reversal STACK will overflow. This will not occur if the data input to this algorithm was created by the LZSD2 compressor. This check is here only to check for improper input data. If DEPTH is greater than MAXDEPTH, then exit at the N point which will stop the decompression process. If DEPTH is less than or equal to MAXDEPTH, then exit at the Y point which will continue the decompress process.

Push first character on STACK 222. TCODE now represents a one character string. Although it is not a requirement of LZSD2, this algorithm maps all single character strings to the same code as the ASCII code for that character. This allows us to simply place TCODE onto the top of the STACK as the first character of the string INCODE without doing a CAM look up. This first character will be used later in the algorithm so its value is stored in a separate variable or register, namely FIRST_CHAR. (Actually, TCODE will not change between now and when FIRST_CHAR is used so a variable/register could be eliminated by simply using TCODE when FIRST_CHAR is needed later. FIRST_CHAR is only used to make the algorithm more readable.) Depth is now equal to the number of characters on the STACK. (Note that the final character placed on the STACK was not counted here but back at the Prep for Decode step.) This value needs to be used and changed while emptying the STACK but the original value will be used later in the algorithm so assign the value of DEPTH to TDEPTH (Temporary DEPTH) which will be used and changed here.

SWAP_FLAG? 224. If the SWAP_FLAG is set then exit at the Y point which will swap the dictionaries. If it is not set then exit at the N point which will empty the string reversal stack and may update the dictionary with (PREVCODE, CH, CD). SWAP_FLAG will only be set in the rare instance in which a switch from raw mode to compress mode occurs just after the raw mode process has signaled that a dictionary swap is needed but before this process has had an opportunity to actually execute the swap.

Swap Dictionaries 226. Since the status field is two bits, there are four possible codes: 00 01 10 11. These codes are mapped to SD, CD, FREE/PD, and INV (invalid), not necessarily in that order. Swapping the dictionaries does not actually change any data in the CAM. What changes is how the status field is interpreted. The code that represented SD represents CD after the swap, CD switches to FREE/PD, FREE/PD becomes INV, and INV becomes SD. INV remains empty because FREE/PD was empty before the swap so INV is empty afterwards. Also, since INV was empty before the swap, after the swap, the Standby Dictionary (SD) is empty.

STACK empty? 228. If TDEPTH is greater than 0 then the STACK is not empty. Exit at the N point which will pop a character off of the STACK. If TDEPTH=0, then the STACK is empty. Exit at the Y point which may add a new string to the CAM.

Pop STACK 230. Take the top character off of the STACK and output it. Subtract one from TDEPTH so the value of TDEPTH is equal to the number of characters on the STACK.

PREVDEPTH OK? 232. Check that value of PREVDEPTH is between 0 and MAXDEPTH, not including the end points of that range. If it is, then exit at the Y point which will add (PREVCODE, FIRST_CHAR, CD) to the CAM if a location is available. If PREVDEPTH=0, then this is the first time through the algorithm to this point since initialization or since switching from raw mode to compress mode so there is not yet a new string to add to the CAM. If PREVDEPTH is greater than or equal to MAXDEPTH, then don't add a new string into the CAM as it would be too long to be usable. In either of these second two cases, exit at the N point which will skip over the "add to CAM" stuff and continue with the algorithm by getting ready for the next code.

Search for FREE/PD 234. Search the CAM for a location that is in the Previous Dictionary, which means a location which contains FREE/PD in the status field. Do not look at the Code or Character fields when doing the search, i.e. a match can be successful no matter what the Code or Character fields contain. Since it is possible for more than one address to meet this condition, the multiple matches must be reduced to one. This is done by using a priority encoder which will select the match address with the lowest value. If a location is found which matches (*,*,FREE/PD) then set the MATCH flag and assign the match address to NEXTCODE.

MATCH of FREE/PD? 236. If the search for a FREE/PD location was successful then exit at the Y point which will add (PREVCODE, FIRST_CODE, CD) to the CAM at the matched location. If the search for (*,*,FREE/PD) failed, then exit at the N point which will swap the dictionaries. Failure to find a FREE/PD location also means that the string represented by (PREVCODE, FIRST_CHAR) will not be entered into the CAM.

Swap Dictionaries 238. Swap the dictionaries using the same procedure described in step 226.

Write String into Dictionary 240. Write (PREVCODE, FIRST_CHAR, CD) into the CAM at address NEXTCODE. This extends the previous input string, PREVCODE, by the character FIRST_CODE. The string is placed into the Current Dictionary (CD) where is will stay until it is occurs again in the input stream and promoted to SD or until a dictionary swap is done and it is demoted to FREE/PD. Assign NEXTCODE to LAST_CODE_BUILT which will be used only if a switch to raw mode occurs at the next compression ratio evaluation.

LAST_CODE_BUILT=INVALID 242. LAST_CODE_BUILT is used in raw mode to prevent the decompressor from building a new string with the most recently built code as a substring. However, if a (PREVCODE, CH) combination that could have been built but was not because the maximum string length was exceeded or the dictionary was full then the most recently built code can be used as a substring for the next code built. To facilitate this, at this point LAST_CODE_BUILT is set to an INVALID address which cannot be matched in the search operation.

Calculate the Compression Ratio (CC) and Prep for next code 244. The compression ratio calculation is done in way that gives more weight to the most recent codes. The Formula used is:

$$CR=CR-(CR/SPAN)+(DEPTH \times WS/CODE\_SIZE) \times 1/SPAN$$

Where SPAN controls how much more recent codes are weighted versus older codes. The larger SPAN is, the less weight recent codes are given. Good results can be obtained using values for SPAN which are between 20 and 100, as determined empirically, but these are not absolute limits. Using a value for SPAN that is a multiple of 2 makes some of the math operations easier and faster in hardware. The preferred embodiment uses a value of 64 for SPAN.

The compression ratio (CC) is limited to a value of MaxCR. In the preferred embodiment, MaxCR=2, so that even if the actual compression was by a factor of more than two, the stored CC is limited. Thus, a transition to incompressible data after very compressible data does not create an extreme delay in the transition to raw mode. Without the limit, an excessively high CC would dominate the moving average calculation for an undesirably extended period.

Since DEPTH is the string length of INCODE, the expression:

$$(DEPTH \times WS/CODE\_SIZE)$$

is the compression ratio for INCODE, i.e. the number of bits in the string represented by INCODE divided by the number of bits in the code INCODE. This calculation is done for each input code while in compress mode and for each code that would have been input if not in raw mode, while in raw mode.

Set PREVCODE equal to the value of INCODE. PREVCODE may be used the next pass through the algorithm to make a new string using the first character of the next string as an extension character. PREVDEPTH is set equal to the value of DEPTH in order to keep track of the string length of PREVCODE. PREVDEPTH is used to prevent a greater than maximum length string from being added to the CAM.

CR<RT 246. If the compression ratio (CR) as calculated in step 244 is less than RT, then a switch to raw mode is desired. Exit at the Y point which signal this switch. If the CR is greater than or equal to RT, then exit at the N point which will continue the algorithm in compress mode. The typical value for RT is 1 but any other values can be used as long as it is less than or equal to the value used for CT. (see step 238.)

Switch to raw mode 248. Switching to raw mode from compress mode is easy. Simply set the RAW_MODE flag and the NEW_TO_RAW flag.

Read Data 250. Get an WS bit character from the input stream and assign it to variable CH. This character is not necessarily an input word as it could be split between two input words, taking n characters from the end of first word and WS-n characters from the beginning of the second word.

EOF? 252. If Read Data failed due to reaching the end of the input stream then exit this control box at the Y point which will end the decompression process. If Read Data succeeded, exit at the N point to continue the decompression process.

Output CH 254. Output the character CH to the output stream. Since we are in raw mode, there is no decoding to do and the input characters can be output as is immediately.

DEPTH=0? 256. If DEPTH=0 then PREVCODE has 0 string length and cannot be used to build a new dictionary entry. Exit at the Y point which will assign a valid code to PREVCODE. DEPTH=0 only occurs immediately after Initialization. If DEPTH>0, then exit at the N point to continue with the raw mode decompression process.

Prep For Next Character 258. This step takes the input character (CH) and assigns it to PREVCODE. PREVCODE now represents a one character string and so DEPTH is set to 1.

Search Dictionaries 260. Search the dictionary for a location which contains PREVCODE in the code field and CH in the character field. Do not look at the status field when doing the search. Use a priority encoder to resolve multiple matches by selecting the match address with the lowest value. If a location is found which matches (PREVCODE, CH, *), then set the MATCH flag and assign the match address to FOUNDCODE. If no location is found which matches (PREVCODE, CH, *) then unset the MATCH flag.

MATCH? 262. Having the data (PREVCODE, CH, *) in the dictionary is not enough to determine whether FOUNDCODE is an acceptable code to use for building a new dictionary entry. First, FOUNDCODE cannot be equal to LAST_CODE_BUILT which prevents the most recently built dictionary entry from being used to build a new dictionary entry. Secondly, in certain rare cases, it is possible for a string to be in the dictionary that is longer than MAXDEPTH. To prevent matching a string like this the string length of FOUNDCODE must be checked. If the string is in the dictionary and the other two tests are OK, then exit this decision box at the Y point which will get another character to add to the string. If the string is not in the dictionary or either of the other two test fail, then exit at the N point which may add (PREVCODE, CH, CD) to the dictionary.

Update Status Bits and Prep For Next Character 264. If FOUNDCODE was a good match, then it needs to be put in the Standby Dictionary (SD). To do this, the status field at FOUNDCODE is set to SD. Then PREVCODE is set equal to the best string match found so far, namely FOUNDCODE and the DEPTH variable is incremented to the new string length of PREVCODE.

SWAP_FLAG? 266. If the SWAP_FLAG is set then exit at the Y point which will swap the dictionaries. If it is not set then exit at the N point which may update the dictionary with (PREVCODE, CH, CD).

Swap Dictionaries 268. Swap the dictionaries using the same procedure described in step 226.

DEPTH<MAXDEPTH? 270. If the string length of PREVCODE is less than the maximum string length then exit at the Y point which will add (PREVCODE, CH, CD) to the dictionary if there is a location available. If DEPTH>= MAXDEPTH then exit at the N point which will not add (PREVCODE, CH, CH) to the dictionary as it is too long to be used as an output code.

Search for Free 272. Search the dictionary for a location which contains FREE/PD in the status field. Do not look at the Code or Character fields when doing the search, i.e. a match can be successful no matter what the Code or Character fields contain. Use a priority encoder to reduce possible multiple matches to the one with the lowest value. If a location is found which matches (*,*,FREE/PD) then set the MATCH flag and assign the match address to NEXTCODE.

MATCH FREE/PD? 274. If the search for a FREE/PD location was successful then exit at the Y point which will add (PREVCODE, CH, CD) to the dictionary at the matched location. If the search for (*,*,FREE/PD) failed, then exit at the N point which will signal that a dictionary swap is needed. Failure to find a FREE/PD location also means that the string represented by (PREVCODE, CH) will not be entered into the dictionary.

Set SWAP_FLAG 276. Set the indicator which signals that a dictionary swap is needed. The dictionary is not swapped immediately so that the raw mode decompression dictionary can stay synchronized with the compress mode decompression dictionary. The dictionary will be swapped after the next string's status field bits have been switched to SD.

Write Dictionary 278. Write (PREVCODE, CH, CD) into the CAM at address NEXTCODE. This extends the string, PREVCODE, by the character CH. The string is placed into the current dictionary (CD) where is will stay until it is found again in the input stream and promoted to SD or a dictionary swap is done and it is demoted to FREE/PD.

LAST_CODE_BUILT=INVALID 280. LAST_CODE_BUILT is used to prevent the raw mode decompressor from building a string in the dictionary using the most recently built code. However, if a (PREVCODE, CH) combination that could have been built but was not because the maximum string length was exceeded or the dictionary was full then the most recently built code can be used as to build a new entry. To facilitate this, LAST_CODE_BUILT is set to an INVALID address which cannot be matched in the search operation.

NEW_TO_RAW? 282. If the NEW_TO_RAW indicator is set, then exit at the Y point which will unset the NEW_TO_RAW indicator. If the NEW_TO_RAW flag is not set, then exit at the N point which will calculate the current compression ratio.

Unset NEW_TO_RAW 284. Unset the NEW_TO_RAW indicator. This indicator is used to skip doing the compression ratio calculation the first time through after a switch to raw mode as the calculation for PREVCODE has already been done in the last compress mode pass. At that time, however, the string was called INCODE.

Calculate Compression Ratio 286. The compression ratio calculation is done using the same formula that was used in the compress mode calculation, namely:

$$CR = CR - (CR/SPAN) + (DEPTH \times WS/CODE\_SIZE) \times 1/SPAN.$$

Prep for Next String 288. Use CH as the initial string for the next search, i.e. assign CH to PREVCODE. PREVCODE now represents a one character string and so DEPTH is set to 1.

CR>CT 290. If the compression ratio (CR) is greater than CT then exit at the Y point which will switch the compressor from raw mode to compress mode. The typical value for CT is 1 but any other value can be used as long as it is greater than or equal to the value used for RT (see step 246). If CR is less than or equal to CT then exit at the N point which will go back to the top of the flow to read the next character.

Switch to Compress Mode 292. To switch from raw mode to compress mode, set PREVDEPTH equal to 0 so the first pass through the compress mode algorithm will not build a new dictionary entry and unset the RAW_MODE flag. From here go to the top of the flow.

There values of variables in the compression process can be adjusted to trade off increases in the average compression ratio with increases in variability of individual compression ratios. The choices made for the following variables in the preferred embodiment result in slightly less than the maximum possible compression ratio for typical data sets with some variability in individual compression ratios. These values are preferred for both the Expanding Data Performance and Compressing Data Performance data sets.

| Variable | Value |
| --- | --- |
| WS | 8 |
| Initial CR | 1.00 |
| RT | 1.00 |
| CT | 1.00 |
| MAXCR | 2.00 |
| SPAN | 64 |
| MAXBITS | 10 |
| MAXDEPTH | 128 |

While the disclosure is described in terms of a preferred embodiment, the following claims are not intended to be so limited.

What is claimed is:

1. A method of compressing a stream of raw data:
   providing a memory device having compression active state and a compression inactive state;
   inputting a raw data segment into the memory device;
   generating a compressed data segment based on the raw data segment;

creating output data based on the compressed data segment when the memory device is in the compression active state, otherwise based on the raw data segment when the memory device is in the compression inactive state;

calculating a compression coefficient as a function of a prior compression coefficient, and the sizes of the raw and compressed data segments; and setting the state of the memory device based on the compression coefficient, such that compressed data is output only when compression has recently proven effective, and raw data is output when compression has recently proven ineffective.

2. The method of claim 1 wherein generating a compressed data segment includes searching for the raw data segment in a dictionary having a plurality of data segments each having an associated code, and if the raw data segment is found, defining the compressed data segment as the code associated with the raw data segment.

3. The method of claim 1 wherein calculating the compression coefficient comprises determining a ratio of the sizes of the raw data segment and the compressed data segment.

4. The method of claim 1 wherein calculating the compression coefficient comprises generating a moving average.

5. The method of claim 1 including storing the compression coefficient, such that it is retained for calculation of the next compression coefficient.

6. The method of claim 1 wherein calculating the compression coefficient comprises:

recalling a prior compression coefficient;

calculating a current compression ratio equal to the size of the raw data segment divided by the size of the compressed data segment; and setting the compression coefficient equal to a weighted average of the prior compression coefficient and the current compression ratio.

7. The method of claim 6 wherein calculating the compression coefficient includes setting the prior compression coefficient equal to the compression coefficient.

8. The method of claim 1 wherein setting the state of the memory device comprises, if the compression coefficient is above a predetermined activation threshold, setting the memory device to the compression active state.

9. The method of claim 1 wherein setting the state of the memory device comprises, if the compression coefficient is below a predetermined deactivation threshold, setting the memory device to the compression inactive state.

10. The method of claim 1 including the steps of storing the output data in a storage device, then decompressing the output data from the storage device by determining for each segment in the output data whether the segment is a raw data segment or a compressed data segment, and if the segment is a compressed data segment, converting the segment to raw data, such that the resulting data stream is identical to the original data stream.

11. A method of storing and retrieving a stream of data comprising the steps:

inputting a sequence of raw data segments;

for a first raw data segment, calculating a compression coefficient;

after calculating a compression coefficient, determining based on the compression coefficient whether to operate in a raw mode in which subsequent data segments are not compressed, or in a compression mode in which subsequent data segments are compressed;

for each subsequent data segment,
compressing the segment if in the compression mode;
storing the segment;
generating a new compression coefficient as a function of a prior compression coefficient;
recalling the segment by determining whether or not the segment was compressed, and decompressing the segment if the segment was compressed; and outputting the sequence of segments.

12. The method of claim 11 wherein compressing the segment includes searching for an identical segment entry in a dictionary having a plurality of data segment entries each having an associated code, and if the identical segment entry is found, defining the segment as the code associated with the segment entry.

13. The method of claim 11 wherein calculating the compression coefficient comprises generating a moving average.

* * * * *

UNITED STATES PATENT AND TRADEMARK OFFICE
CERTIFICATE OF CORRECTION

PATENT NO.   : 5,686,912  
DATED        : November 11, 1997  
INVENTOR(S)  : Airell Clark II Page 1 of 1

It is certified that error appears in the above-identified patent and that said Letters Patent is hereby corrected as shown below:

Column 1,  
Line 57, delete "from" and insert therefor -- form --

Column 3,  
Line 61, delete "oft he" and insert therefor -- of the --

Column 9,  
Line 22, after "where" delete "is" and insert thereof -- it --

Column 10,  
Line 36, after "variable" delete "is"  
Line 37, delete "then" and insert therefor -- the --

Column 11,  
Line 38, delete "possible" and insert therefor -- possibly --

Column 13,  
Line 30, delete "where is" and insert therefor -- where it -- and after "until it" delete -- is --

Signed and Sealed this

Ninth Day of July, 2002

*Attest:*

*Attesting Officer*

JAMES E. ROGAN  
*Director of the United States Patent and Trademark Office*